(12) United States Patent
Chang et al.

(10) Patent No.: US 8,133,661 B2
(45) Date of Patent: Mar. 13, 2012

(54) SUPERIMPOSE PHOTOMASK AND METHOD OF PATTERNING

(75) Inventors: Hsiao Chih Chang, Yongkang (TW); Dong-Hsu Cheng, Tainan (TW); Chih-Chiang Tu, Tauyen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 118 days.

(21) Appl. No.: 12/582,959

(22) Filed: Oct. 21, 2009

(65) Prior Publication Data

US 2011/0091797 A1  Apr. 21, 2011

(51) Int. Cl.
G03F 7/20 (2006.01)

(52) U.S. Cl. .................. 430/312; 430/394; 430/396

(58) Field of Classification Search .................. 430/311, 430/394, 396, 312
See application file for complete search history.

(56) References Cited

U.S. PATENT DOCUMENTS

| 6,511,791 B1 * | 1/2003 | Bukofsky et al. ............. 430/311 |
| 2008/0020557 A1 | 1/2008 | Lim |

* cited by examiner

*Primary Examiner* — Kathleen Duda
(74) *Attorney, Agent, or Firm* — Haynes and Boone, LLP (57) ABSTRACT

Provided is a photomask that includes a substrate having a first region and a second region, a first pattern disposed in the first region of the substrate, and a second pattern disposed in the second region of the substrate. The first and second patterns are a decomposition of a design pattern to be transferred onto a wafer in a lithography process.

13 Claims, 8 Drawing Sheets

SUPERIMPOSE PHOTOMASK AND METHOD OF PATTERNING

BACKGROUND

Semiconductor technologies are continually progressing to smaller feature sizes, for example down to feature sizes of 32 nanometers, and below in advanced technologies. A patterned photoresist (resist) layer is typically used to produce such small feature sizes. Maintaining a desired critical dimension (CD) can be very difficult for various reasons. A double patterning lithography process has been introduced to form various features with split patterns. Although this has been satisfactory for its intended purpose, it has not been satisfactory in all respects. For example, current double patterning lithography process utilizes multiple masks which involve high manufacturing costs and low throughput.

SUMMARY

One of the broader forms of an embodiment of the present invention involves a photomask. The photomask includes a substrate having a first region and a second region; a first pattern disposed in the first region of the substrate; and a second pattern disposed in the second region of the substrate. The first and second patterns are a decomposition of a design pattern to be transferred onto a wafer in a lithography process.

Another one of the broader forms of an embodiment of the present invention involves a method of transferring a design pattern onto a wafer in a lithography process. The method includes providing a photomask having first and second patterns disposed in first and second areas, respectively, the first and second patterns are a decomposition of the design pattern; performing a first exposure with the first and second patterns of the photomask to transfer a first set of the first and second areas onto the wafer; adjusting a relative position between the wafer and the photomask by a distance substantially less than a scanner field; and performing a second exposure with the first and second patterns of the photomask to transfer a second set of the first and second areas onto the wafer, wherein the first and second sets overlap such that the design pattern is formed.

Yet another one of the broader forms of an embodiment of the present invention involves a method of transferring a design pattern onto a wafer in a lithography process. The method includes providing a photomask having first and second patterns disposed in first and second areas, respectively, the first and second patterns are a decomposition of the design pattern; positioning a scanner at a position; performing a first scanning and exposing with the first and second patterns of the photomask such that a set of first patterns are transferred onto a first row of the wafer and a set of second patterns are transferred onto a second row of the wafer; positioning the scanner at the position with an offset less than a scanner field; and performing a second scanning and exposing with the first and second patterns of the photomask such that another set of second patterns are transferred onto the first row thereby forming a set of design patterns, and another set of first patterns are transferred onto the second row thereby forming another set of design patterns.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
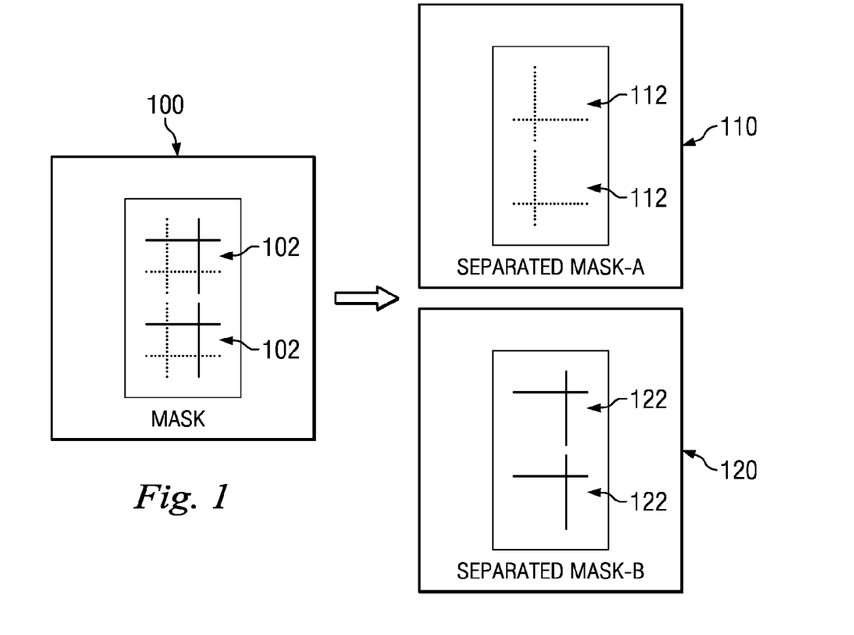
FIG. 1 is a diagrammatic view of a single photomask being partitioned into multiple photomasks.

Referring to FIG. 1, illustrated is a diagrammatic view of a single photomask 100 that is partitioned into two separate photomasks. The photomask 100 (also referred to as "mask" or "reticle") is employed in lithography for transferring an image of an electronic circuit onto a semiconductor wafer. The photomask 100 may include a transparent substrate having fused quartz (SiO), calcium fluoride ($CaF_2$), or other suitable material. The photomask 100 may further include an absorption layer formed on the transparent substrate (of the electronic circuit pattern), using chromium (Cr), iron oxide, or an inorganic film made with MoSi, ZrSiO, SiN, $MoSiON_x$, and/or TiN. The absorption layer may have a multilayer configuration. In some embodiments, the absorption layer may include an anti-reflective coating (ARC) layer.

The absorption layer may be patterned to have one or more openings where radiation beams may travel through without being absorbed and have one or more absorption areas where the radiation beams may be completely or partially blocked thereby. For example, the photomask 100 includes a pattern 102 that comprises various features such as polygate lines, metal lines, contacts, trenches, or other circuit design features known in the art. These features may be shaped as lines, line ends, contact holes, elbow shapes, T-shapes, or other suitable polygons. As feature sizes continue to shrink and become more dense in advanced technologies (e.g., 32 nm, and below), it may be challenging to maintain desired critical dimensions of such features due to limitations of the lithography process. For example, the lithography process has a minimum pitch resolution which is determined by the wavelength of the light beam and the numerical aperture of the exposure tool. One technique is to partition the photomask 100 into two separate masks 110, 120 (e.g., mask A and B) and perform a double patterning lithography (DPL) process. In the present example, the pattern 102 of photomask 100 is partitioned into separate patterns 112, 122 of photomasks 110, 120, respectively. The technique for splitting the pattern 102 varies and will be discussed in more detail below. The separate patterns 112, 122 are less dense than the pattern 102. Accordingly, the resolution and depth of focus (DOF) of the lithography process is improved by exposing each of the patterns 112, 122 in a DPL process rather than a single exposure of the pattern 102.

Figure 2:
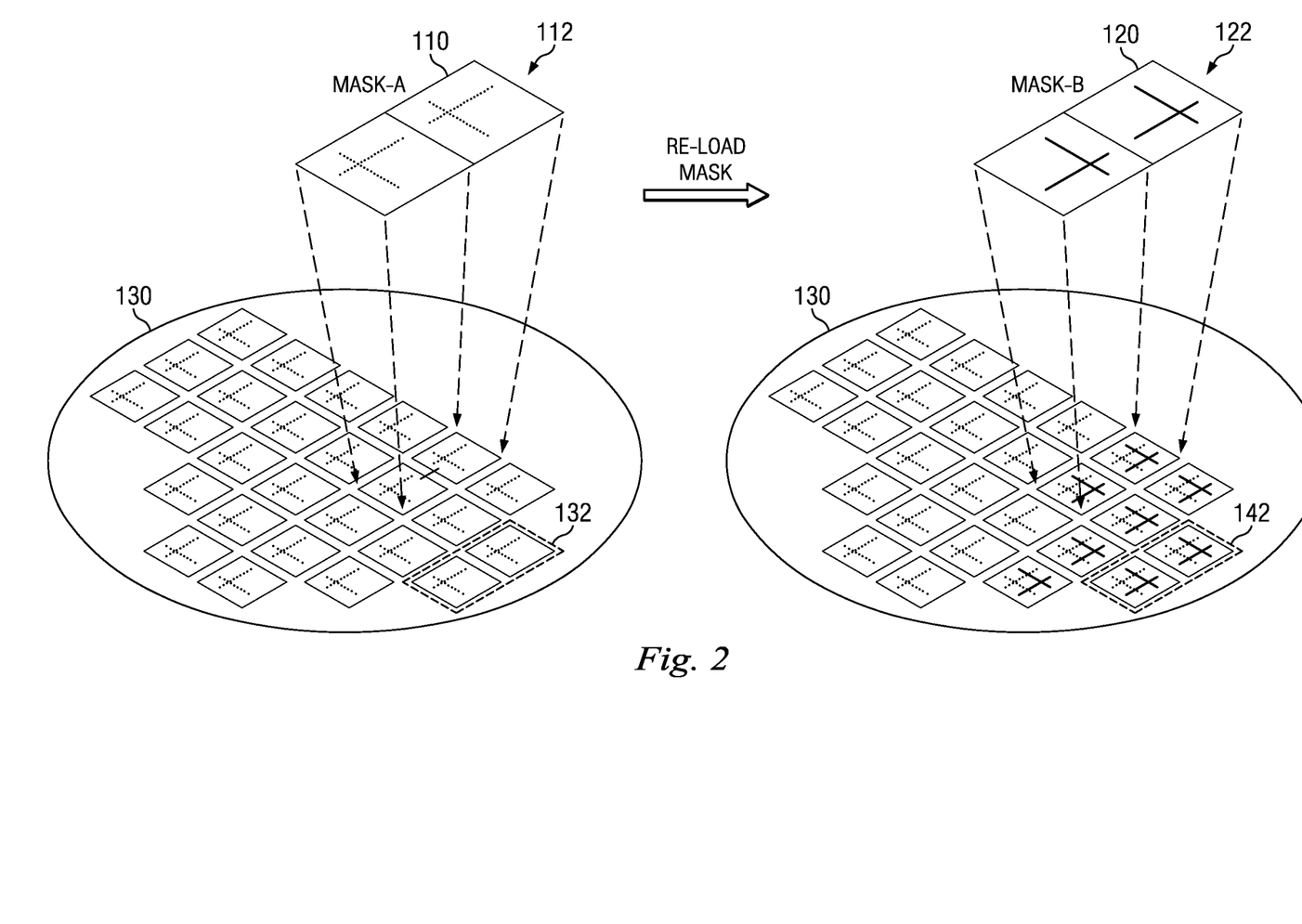
FIG. 2 is a diagrammatic view of a double patterning lithography process being performed with the multiple photomasks of FIG. 1.

Referring also to FIG. 2, illustrated is a diagrammatic view of a double patterning lithography (DPL) process being performed on the separated photomasks 110, 120 of FIG. 1. The DPL process utilizes a lithography apparatus (not shown) to pattern a wafer 130. The lithography apparatus includes a radiation source to provide radiation beams (radiation energy). The radiation source may be a suitable light source such as an ultra-violet (UV), deep ultra-violet (DUV), or extreme ultra-violet (EUV) source. For example, the radiation source may be, but not limited to, a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a wavelength below approximately 100 nm.

The lithography apparatus further includes a lens system to project radiation energy for lithography patterning. The lens system includes an illumination module (e.g., a condenser) having a single lens, or multiple lenses and other lens components. In one or more embodiments, the illumination module may include microlens arrays, shadow masks, or other structures designed to aid in directing radiation beams from the radiation source onto a photomask. The lithography apparatus further includes a mask stage having a scan function. The mask stage is operable to secure the photomask and manipulate the photomask in transitional and/or rotational modes. The lithography apparatus further includes a wafer stage for holding and manipulating a wafer to be patterned in transitional and/or rotational modes during a lithography patterning process. It is understood that the manipulation of the wafer is considered relative to the photomask, so that one or both of the mask and wafer stages can move to achieve the desired manipulation. The wafer stage may be designed to implement a step-and-scan process or other proper exposure processes.

In an embodiment, the wafer 130 is a semiconductor wafer having silicon, germanium, diamond, or a compound semiconductor. The wafer 130 may alternatively include other materials such as glass for thin-film transistor liquid crystal display (TFT_LCD) devices or fused silicon/calcium fluoride for photomasks. The wafer 130 may include a plurality of layers formed thereon, each having patterned structures. The wafer 130 may include a material layer formed thereon and to be patterned. The wafer 130 is further coated with an imaging layer for lithography patterning process such as photoresist. An exemplary photoresist includes chemical amplification resist (CAR). The lithography apparatus may include other functional modules such as an alignment device and/or a focus servo device capable of detecting alignment, and focusing a non-developed image layer, respectively.

In the DPL process, the photomask 110 (mask A) with pattern 112 is loaded onto the mask stage, and the wafer 130 is loaded onto the wafer stage. As noted above, the lithography apparatus includes an alignment device that is used to align the photomask 110 and the wafer 130. The radiation beam may scan over the photomask 110 to expose a single field 132 on the wafer 130. As such, the pattern 112 is transferred onto the wafer 130 at the exposure field 132. The lithography apparatus steps the wafer 130 to a next field (e.g., one scanning field) where the radiation beam again scans over the photomask 110 to expose another field. This step-and-scan process is performed until the entire wafer 130 has been exposed with the pattern 112.

The DPL technology may implement a litho-etch-litho-etch (LELE) process or a litho-litho-etch (LLE) process. In the LELE process, the wafer undergoes an etching process after patterning with the first photomask, then the wafer is re-loaded onto the wafer stage and is patterned with the second photomask as discussed below, and then undergoes another etching process after patterning with the second photomask. In the LLE process, the wafer undergoes one etching process after patterning with the second photomask as discussed below.

The photomask 110 is removed from the mask stage, and the photomask 120 with pattern 122 is re-loaded onto the mask stage. The alignment device aligns the photomask 120 and the wafer 130 to ensure that the pattern 122 will be exposed at proper locations (e.g., exposure fields) relative to the pattern 112 already transferred on the wafer 130. The radiation beam may scan over the photomask 120 to expose a single field 142 on the wafer 130. As such, the pattern 122 is transferred over the pattern 112 thereby forming the pattern 102 at the exposure field 142. The lithography apparatus steps the wafer 130 to a next field where the radiation beam again scans over the photomask 120 to expose another field. This step-and-scan process is performed until the entire wafer 130 has been exposed with the pattern 122 thereby forming the pattern 102 at all the exposure fields.

It has been observed that a registration quality of the DPL process (e.g., overlay accuracy of two pattern exposures) may be difficult to control due to re-loading and aligning the second photomask and/or the wafer for the second patterning process. Also, additional overhead time is needed to re-load and align another photomask and/or the wafer thereby resulting in low wafer throughput. Further, the costs associated with fabricating photomasks is a major factor in semiconductor device fabrication, and thus employing multiple photomasks increases the overall costs of fabrication.

Figure 3:
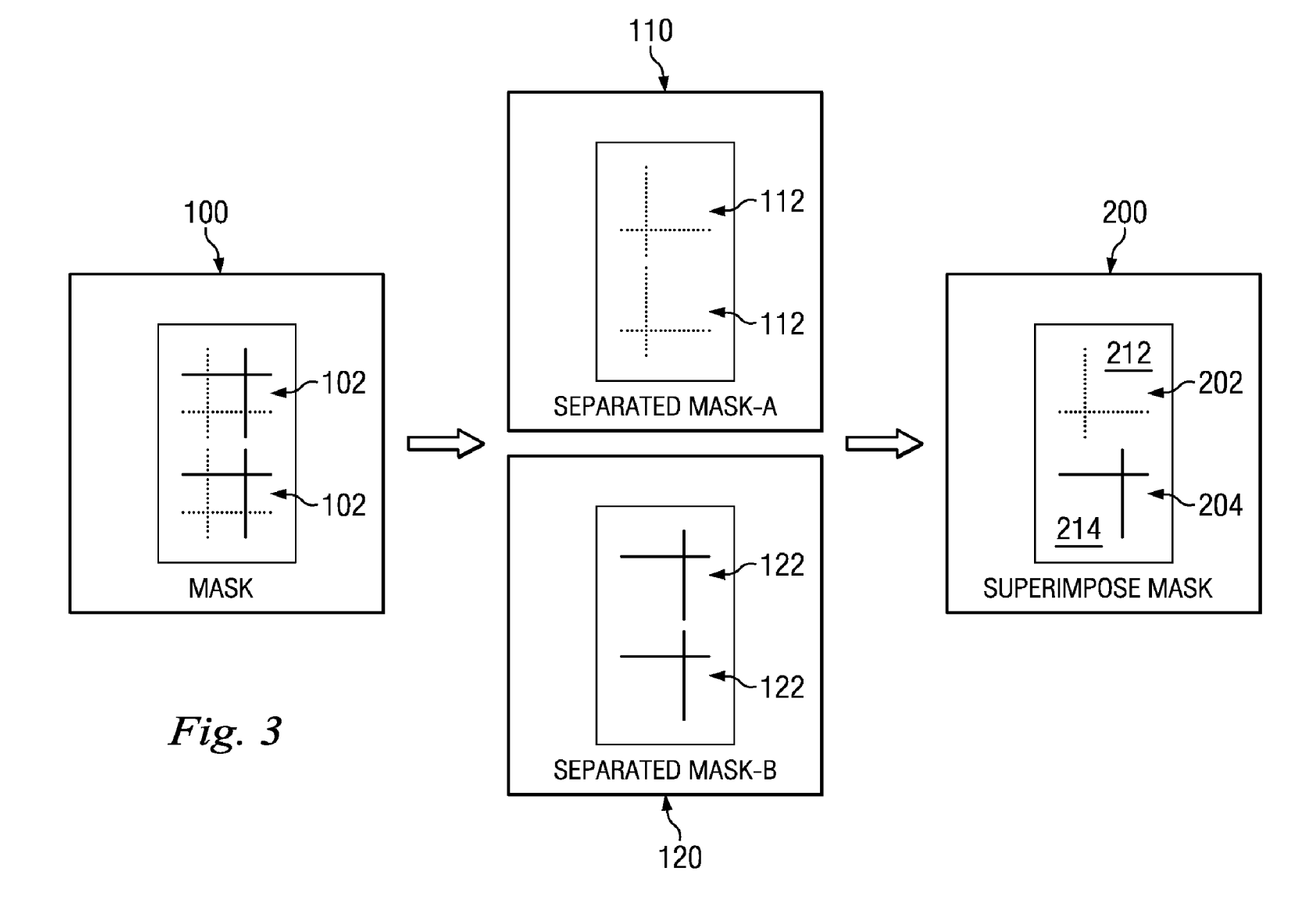
FIG. 3 is a diagrammatic view of a superimpose photomask being generated from a single photomask according to various aspects of the present disclosure.

Referring to FIG. 3, illustrated is a diagrammatic view of a superimpose photomask being generated from a single photomask according to various aspects of the present embodiment. Similar features in FIGS. 1 and 3 are numbered the same for the sake of clarity and simplicity. As discussed above with reference to FIG. 1, a single photomask 100 with pattern 102 is partitioned into two separate photomasks 110, 120 with split patterns 112, 122, respectively. The split patterns 112, 122 can be placed and manufactured in a single photomask that is referred to as a superimpose photomask. The superimpose photomask 200 includes a pattern 202 that is disposed in a region 212 of the photomask, and a pattern 204 that is disposed in another region 214 of the photomask. The pattern 202 corresponds to the split pattern 112 of photomask 110, and the pattern 204 corresponds to the split pattern 122 of photomask 120. The regions 212, 214 are positioned in a such manner that the patterns 202, 204 are exposed on a wafer in the same scanner stage movement. Thus, the wafer can be patterned using the superimpose mask 200 in a litho-etch-litho-etch (LELE) process or a litho-litho-etch (LLE) process as will discussed in detail below. Accordingly, the cost benefits of employing a single superimpose photomask instead of multiple photomasks for split patterns can be realized.

Figure 4:
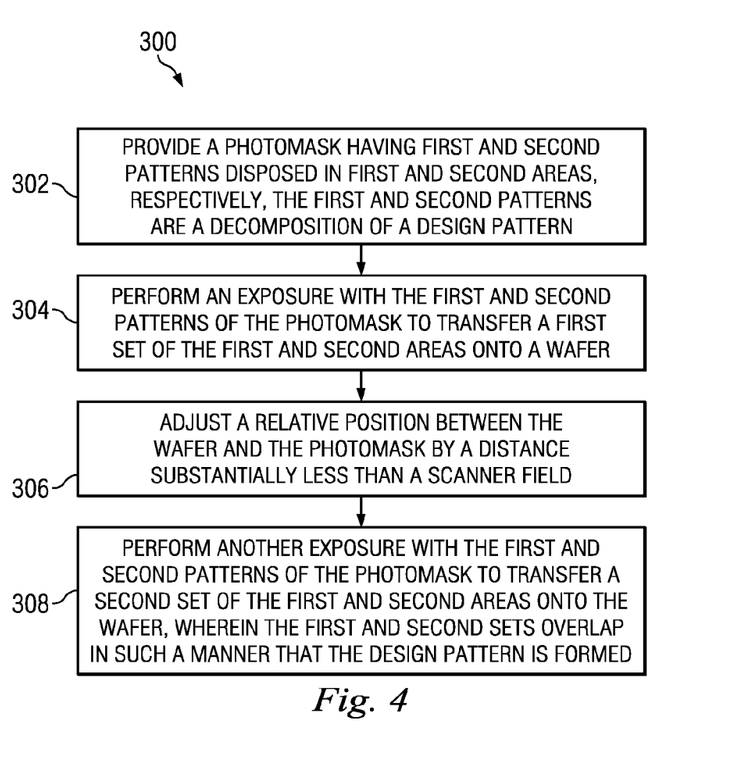
FIG. 4 is a flowchart of a method for patterning a wafer using a superimpose mask according to various aspects of the present disclosure.

Referring to FIG. 4, illustrated is a flowchart of a method 300 of patterning a wafer using a superimpose photomask according to an embodiment of the present disclosure. The method 300 begins with block 302 in which a photomask having first and second patterns disposed in first and second areas, respectively, is provided. The first and second patterns are a decomposition of a design pattern that is to be patterned on a wafer. The method 300 continues with block 304 in which an exposure process is performed with the first and second patterns of the photomask to transfer a first set of the first and second areas onto a wafer. The method 300 continues with block 306 in which a scanner is moved by a distance substantially less than a scanner field. The method 300 continues with block 308 in which another exposure process is performed with the first and second patterns of the photomask to transfer a second set of the first and second areas onto the wafer. The first and second sets overlap in such a manner that the design pattern is formed. The discussion that follows illustrates a patterning process according to the method 300 of FIG. 4.

Figure 5A:
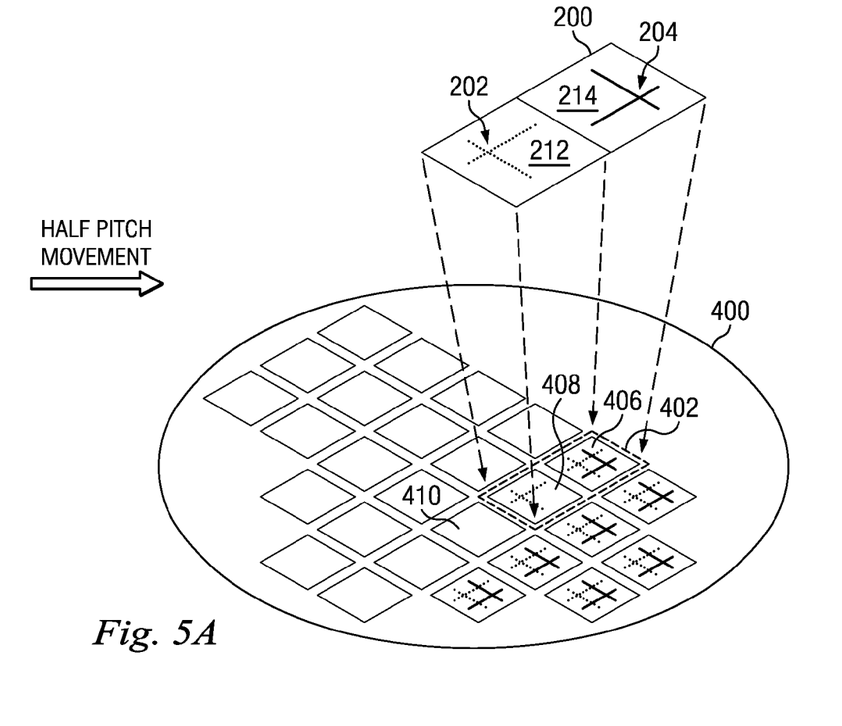
FIGS. 5A and 5B are diagrammatic views of a wafer being patterned according to the method of FIG. 4.
Figure 5B:
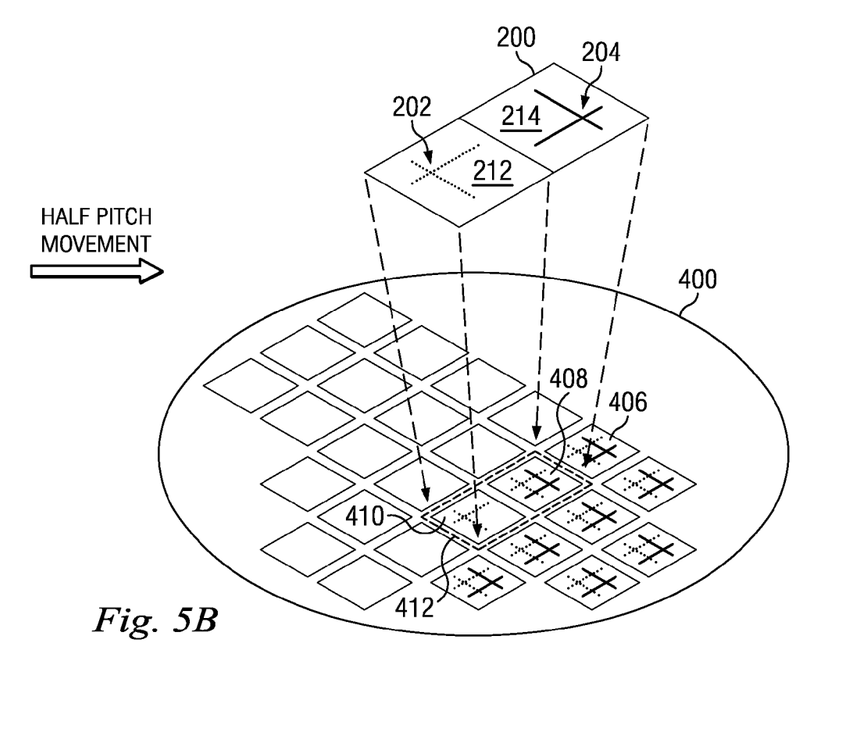

Referring to FIGS. 5A and 5B, illustrated is a diagrammatic view of a patterning process that utilizes the superimpose mask 200 of FIG. 3. In FIG. 5A, the superimpose mask 200 is loaded onto a mask stage, and a wafer 400 is loaded onto a wafer stage of a lithography apparatus. An alignment device aligns the photomask 200 and the wafer 400. It should be noted that several step-and-scan processes with the photomask 200 have been performed, and that an intermediate stage of the lithography process is shown in FIG. 5A following exposure of the photomask 200. In the present embodiment, the steps are each a half pitch wafer stage movement instead of a full pitch wafer stage movement. A radiation beam may scan over the photomask 200 to expose a single field 402 on the wafer 400. As such, the pattern 202 disposed within region 212 is transferred onto a region 408 of the wafer 400, and the pattern 204 disposed within region 214 is transferred onto a region 406 of the wafer 400. The regions 406, 408 may each define a die (or chip) of an integrated circuit. It should be noted that the region 406 was already exposed with the pattern 202 in a previous scan, and thus a design pattern 102 (of FIG. 3) is formed in the region 406 following the present scan of the photomask 200. That is, consecutive scans of the superimpose photomask 200 will overlap in a region on the wafer 400 in such a manner that the design pattern 102 is formed by the overlapping of the split patterns 202 and 204.

In FIG. 5B, the wafer 400 is moved via the wafer stage by a distance that is less than a scanner field. As noted above, the wafer 400 is moved by about half a scanner field (e.g., half pitch wafer stage movement) such that a single exposure field now encompasses regions 408 and 410 of the wafer 400. It is noted that the previous exposure field in FIG. 5A encompassed regions 406 and 408. The radiation beam may scan over the photomask 200 to expose a single field 412 on the wafer 400. As such, the pattern 202 disposed within region 212 is transferred onto a region 410 of the wafer 400, and the pattern 204 disposed within region 214 is transferred onto the region 408 of the wafer 400. The region 410 defines another die (or chip). The region 408 was already exposed with the pattern 202 as discussed above in FIG. 5A. Thus, the design pattern 102 (of FIG. 3) is formed by the overlapping of the split patterns 202, 204 in the region 408. The step-and-scan process is repeated with the half-pitch wafer stage movement until the design pattern 102 is formed on the entire wafer 400. The patterning process discussed with reference to FIGS. 5A and 5B may be implemented in a litho-litho-etch (LLE) process. Each of the regions 406, 408, 410 on the wafer 400 undergo two exposures to form the design pattern, and a single etching process is performed to complete the LLE process.

Although the step movement above has been described with reference to movement of the wafer via the wafer stage, it is the change in the relative position between the wafer and the photomask that is important to achieve the desired overlapping of consecutive exposures of the photomask. Therefore, one or both of the mask and wafer stages can move to accomplish the desired manipulation. Accordingly, there may be instances where the movement is accomplished by movement of the photomask in relation to the wafer. Further, there may be other instances where the movement is accomplished by movement of both the wafer and the photomask in relation to each other.

It should be noted that a half pitch wafer stage movement corresponds to a superimpose photomask that has split patterns in two regions. However, other configurations with more than two regions of split patterns can be implemented as well. For example, a superimpose photomask may include split patterns A and B that are disposed in four regions of the photomask (e.g., pattern A, pattern B, pattern A, pattern B). In this situation, the step would include a one-fourth pitch wafer stage movement instead of the half pitch wafer stage movement. Further, it should be noted that using a superimpose photomask does not require re-loading and aligning a second mask for the second patterning process. Also, the split patterns on the superimpose photomask are exposed onto the wafer in the same scanner stage movement. Thus, the registration quality is improved and wafer throughput is increased.

Figure 6:
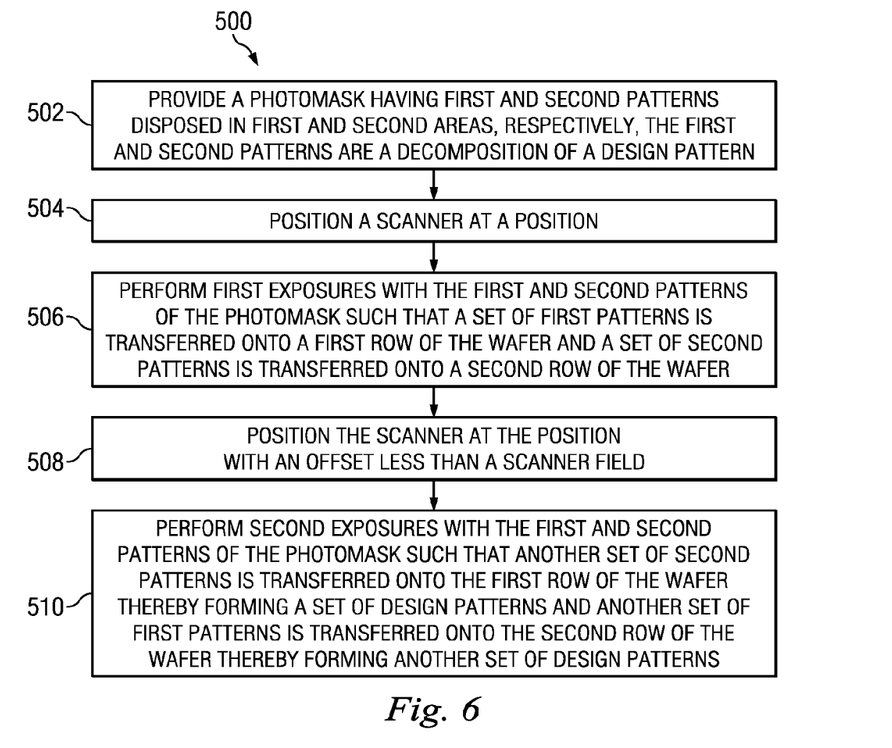
FIG. 6 is a flowchart of another method for patterning a wafer using a superimpose mask according to various aspects of the present disclosure.

Referring to FIG. 6, illustrated is a flowchart of a method 500 of patterning a wafer using a superimpose photomask according to another embodiment of the present disclosure. The method 500 begins with block 502 in which a photomask having first and second patterns disposed in first and second areas, respectively, is provided. The first and second patterns are a decomposition of a design pattern that is to be patterned on a wafer. The method 500 continues with block 504 in which a scanner is positioned at a position. The method 500 continues with block 506 in which first exposures with the first and second patterns of the photomask are performed such that a set of first patterns is transferred onto a first row of the wafer and a set of second patterns is transferred onto a second row of the wafer. The method 500 continues with block 508 in which the scanner is positioned at the position with an offset less than a scanner field. The method 500 continues with block 510 in which second exposures are performed with the first and second patterns of the photomask such that another set of second patterns is transferred onto the first row of the wafer thereby forming a set of design patterns and another set of first patterns is transferred onto the second row of the wafer thereby forming another set of design patterns. The discussion that follows illustrates a patterning process according to the method 500 of FIG. 6.

Figure 7A:
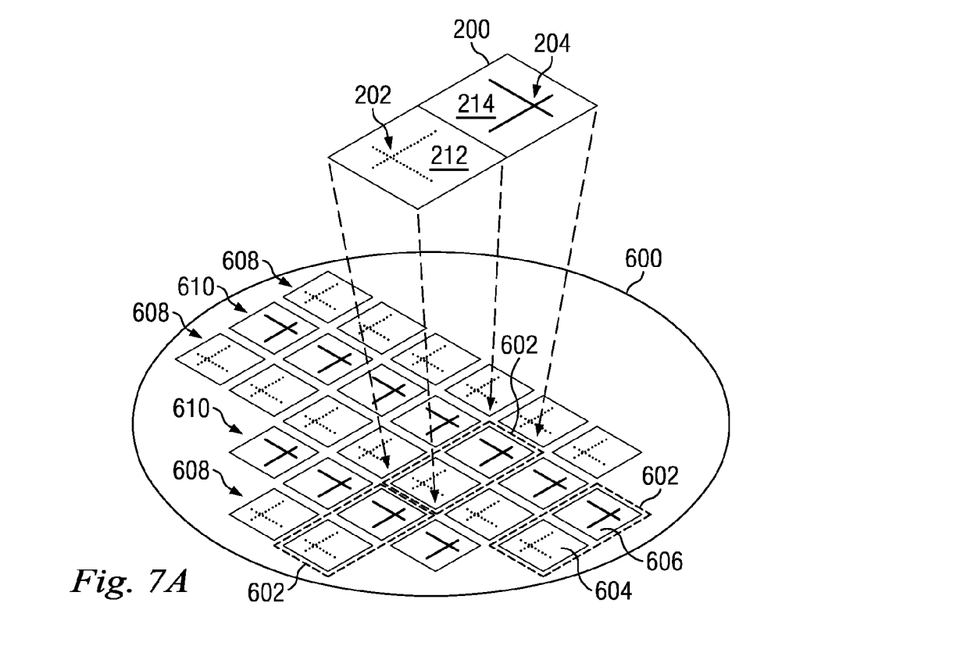
FIG. 7A to 7C are diagrammatic views of a wafer being patterned according to the method of FIG. 6.
Figure 7B:
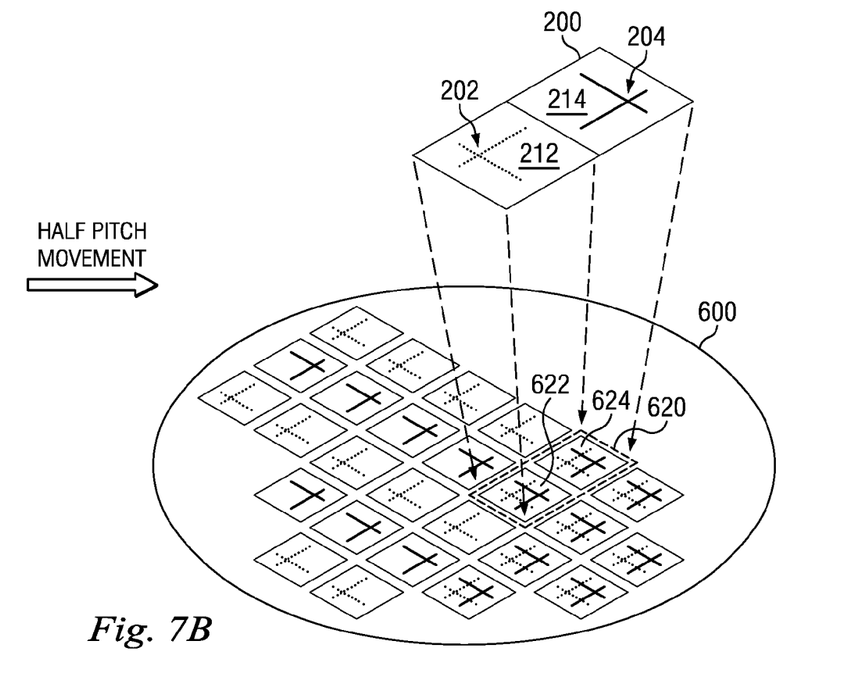
Figure 7C:
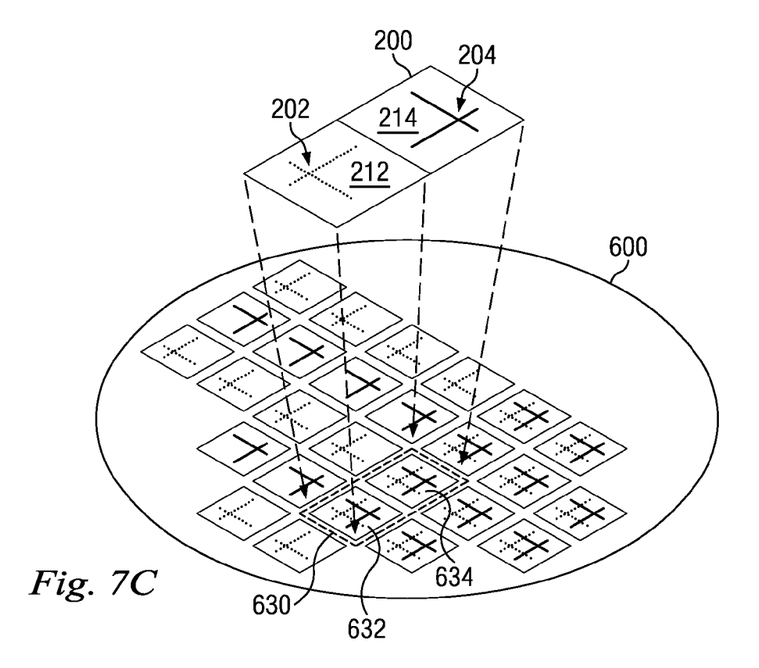

Referring to FIGS. 7A to 7C, illustrated is a diagrammatic view of another patterning process that utilizes the superimpose mask 200 of FIG. 3. In FIG. 7A, the superimpose mask 200 is loaded onto a mask stage, and a wafer 600 is loaded onto a wafer stage of a lithography apparatus. An alignment device aligns the photomask 200 and the wafer 600. The radiation beam may scan over the photomask 200 to expose a single field 602 on the wafer 600. As such, the pattern 202 disposed within region 212 is transferred onto a region 604 of the wafer 600, and the pattern 204 disposed within region 214 is transferred onto a region 606 of the wafer 600. The regions 604, 606 may each define a die (or chip) of an integrated circuit. The lithography apparatus steps the wafer 600 to a next field (e.g., one scanning field) where the radiation beam again scans over the photomask 200 to expose another field 602. This step-and-scan process is performed until the entire wafer 600 has been exposed with the patterns 202, 204. Thus, after this first exposure process, a set 608 of patterns 202 are formed in alternating rows of the wafer 600, and a set 610 of patterns 204 are formed in alternating rows of the wafer 600. That is, the split patterns 202 and 204 are exposed at different rows of the wafer 600 following this first exposure process.

In FIG. 7B, the wafer 600 is moved via the wafer stage to a position that includes an offset that is less than a scanner field. In the present embodiment, the wafer 600 is moved by an offset of about half a scanner field (e.g., half pitch wafer stage movement) in relation to the position of the wafer 600 in the first exposure process discussed above in FIG. 7A. The radiation beam may scan over the photomask 200 to expose a single field 620 on the wafer 600. As such, the pattern 202 disposed within region 212 is transferred onto a region 622 of the wafer 600, and the pattern 204 disposed within region 214 is transferred onto a region 624 of the wafer 600. The regions 622, 624 may each define a die (or chip) of an integrated circuit. It is noted that the region 622 was part of the set 610 of patterns 204 in one row of the wafer 600, and the region 624 was part of the set 608 of patterns 202 in another row of the wafer 600. Thus, design patterns 102 (FIG. 3) are formed by the overlapping of the patterns 202, 204 in the regions 622, 624 following the present scan of the photomask 200.

In FIG. 7C, the wafer 600 is moved via the wafer stage by one scanning field. The radiation beam may scan over the photomask 200 to expose a single field 630 on the wafer 600. It is noted that the exposure field 630 is offset by a half pitch in relation to the position of the wafer in the first exposure process discussed above in FIG. 7A. As such, the pattern 202 disposed within region 212 is transferred onto a region 632 of the wafer 600, and the pattern 204 disposed within region 214 is transferred onto a region 634 of the wafer 600. The regions 632, 634 may each define a die (or chip) of an integrated circuit. It is noted that the region 632 was part of the set 610 of patterns 204 in one row of the wafer 600, and the region 634 was part of the set 608 of patterns 202 in another row of the wafer 600. Thus, design patterns 102 (FIG. 3) are formed by the overlapping of the patterns 202, 204 in the regions 632, 634 following the present scan of the photomask 200. The step-and-scan process is repeated until the design pattern 102 is formed on the entire wafer 600. It should be noted that the second exposure process discussed in FIGS. 7B and 7C is similar to the first exposure process discussed in FIG. 7A in that the patterns 202, 204 are exposed at different rows of the wafer 600. However, the patterns 202 are formed in the rows that included the set 610 of patterns 204, and the patterns 204 are formed in the other rows that included the set 608 of patterns 202. Accordingly, each of regions 604, 606, 622, 624, 632, 634 of the wafer undergoes two exposures to form the design pattern 102 (FIG. 3). Thus, the patterning process discussed with reference to FIGS. 7A to 7C may be implemented in a litho-etch-litho-etch (LELE) process where the wafer undergoes an etching process after the first exposure process and another etching process after the second exposure process.

It should be noted that a half pitch wafer stage movement corresponds to a superimpose photomask that has split patterns in two regions. However, other configurations with more than two regions of split patterns can be implemented as well. For example, a superimpose mask may include split patterns A and B that are disposed in four regions of the photomask (e.g., pattern A, pattern B, pattern A, pattern B). In this situation, the step would include a one-fourth pitch wafer stage movement instead of the half pitch wafer stage movement. Further, it should be noted that using a superimpose mask does not require re-loading and aligning a second mask for the second patterning process. Also, the split patterns are exposed onto the wafer in the same scanner stage movement. Thus, the registration quality is improved and wafer throughput is increased.

Figure 8A:
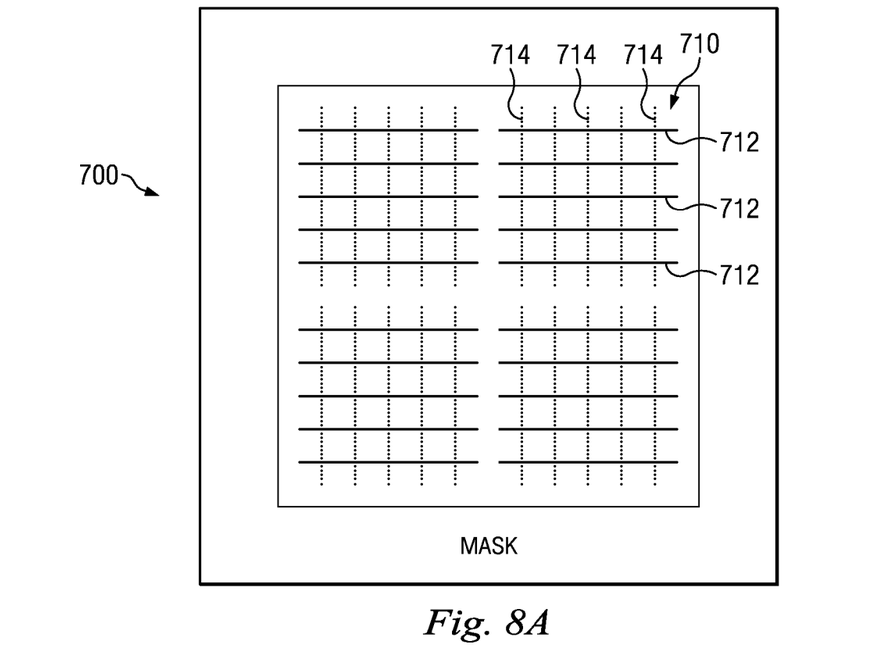
FIGS. 8A and 8B are top views of a photomask and a superimpose photomask, respectively, having a pattern that is partitioned with respect to an orthogonal split characteristic.
Figure 8B:
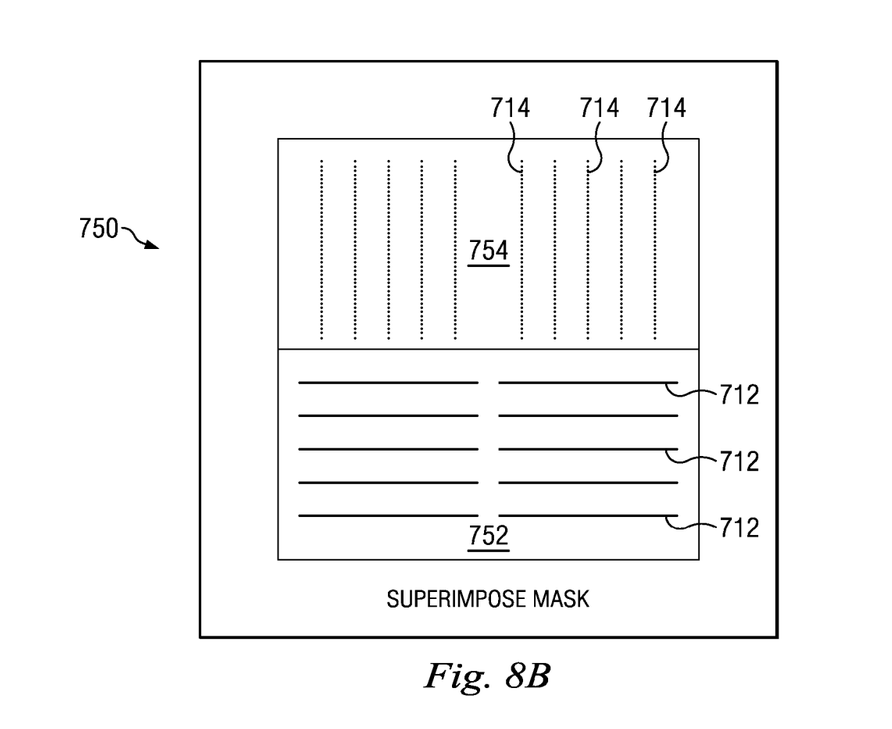

Referring to FIGS. 8A and 8B, illustrated is an example of a pattern that is split into two patterns according to an orthogonal characteristic. In FIG. 8A, a photomask 700 includes a pattern 710 that has features 712 that are oriented in a first direction and features 714 that are oriented a second direction orthogonal to the first direction. Accordingly, the pattern 710 can be split into two patterns, one including the features 712 and another including the features 714. In FIG. 8B, a superimpose mask 750 includes a region 752 that includes the features 712 and another region 754 that includes the features 714. The regions 752 and 754 are positioned in a such manner that the features 712, 714 are exposed on a wafer in the same scanner stage movement as discussed above with reference to FIGS. 5 and 7.

Figure 9A:
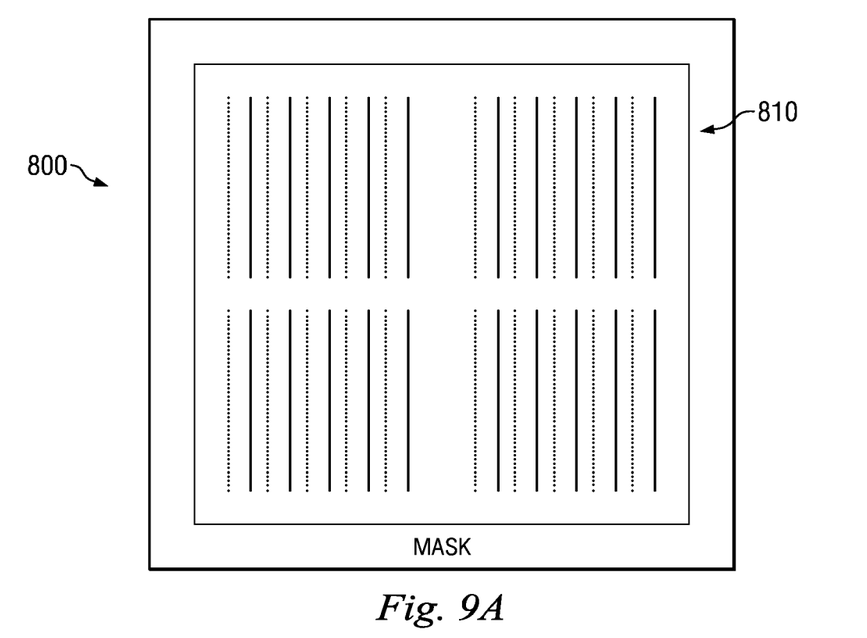
FIGS. 9A and 9B are top views of a photomask and a superimpose photomask, respectively, having a pattern that is partitioned with respect to a pitch split characteristic.
Figure 9B:
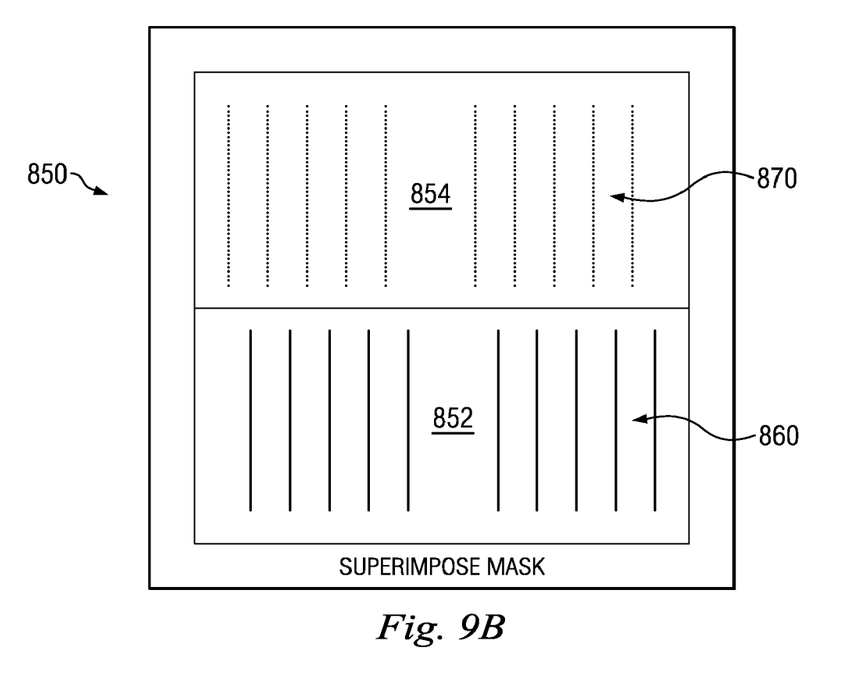

Referring to FIGS. 9A and 9B, illustrated is an example of a pattern that is split into two patterns according to a pitch characteristic. In FIG. 9A, a photomask 800 includes a pattern 810 that has parallel lines with a pitch. The pitch is a distance between adjacent lines. The pattern 810 can be split into two patterns with parallel lines with a pitch that is about twice the original pitch. That is, alternating lines can be included in one split pattern, and the other alternating lines can be included in another split pattern. In FIG. 9B, a superimpose mask 850 includes a region 852 that includes parallel lines 860 with a pitch that is about twice the original pitch, and another region 854 that includes parallel lines 870 with a pitch that is about twice the original pitch. The regions 852 and 854 are positioned in a such manner that the parallel lines 860, 870 are exposed on a wafer in the same scanner stage movement as discussed above with reference to FIGS. 5 and 7.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions, and alterations herein without departing from the spirit and scope of the present disclosure. For example, the methods and photomasks disclosed herein are applicable to all pattern split methods currently available in DPL technology or pattern spilt methods available in future developed patterning processes that utilize multiple photomasks. Further, the methods and photomasks disclosed herein may be utilized in other types of lithography apparatuses such as an immersion lithography apparatus.

What is claimed is:

1. A method of transferring a design pattern onto a wafer in a lithography process, comprising:
   providing a photomask having first and second patterns disposed in first and second areas, respectively, the first and second patterns being different and are a decomposition of the design pattern;
   performing a first exposure with the first and second patterns of the photomask to transfer the first pattern to a first area of the wafer and the second pattern to a second area of the wafer;
   adjusting a relative position between the wafer and the photomask by a distance substantially less than a scanner field; and
   performing a second exposure with the first and second patterns of the photomask to transfer the first pattern to a third area of the wafer and the second pattern to the first area of the wafer, wherein the first pattern and the second pattern overlap in the first area of the wafer such that the design pattern is formed in the first area.

2. The method of claim 1, wherein the distance is substantially equal to about half of the scanner field.

3. The method of claim 2, further comprising thereafter:
   adjusting another relative position between the wafer and the photomask by another distance substantially equal to about half of the scanner field;
   performing a third exposure with the first and second patterns of the photomask to transfer the first pattern to a fourth area of the wafer and the second pattern to the third area of the wafer, wherein the first pattern and the second pattern overlap in the third area such that another design pattern is formed in the third area.

4. The method of claim 1, wherein the first pattern includes features that are positioned in a first configuration, and wherein the second pattern includes features that are positioned in a second configuration different from the first configuration.

5. The method of claim 1, wherein the method is implemented in a litho-litho-etch process.

6. The method of claim 1, wherein the method is repeated to transfer a set of design patterns on the entire wafer without having to re-load another photomask.

7. The method of claim 1, wherein the method is repeated to transfer a set of design patterns on the entire wafer without having to re-align another photomask and the wafer.

8. The method of claim 1, further comprising performing an etch process on the wafer to form a circuit pattern having a first feature and a second feature different from the first feature, wherein the first feature is transferred from the first pattern on the photomask and the second feature is transferred from the second pattern on the photomask.

9. A method of transferring a design pattern onto a wafer in a lithography process, comprising:
   providing a photomask having first and second patterns disposed in first and second areas, respectively, the first and second patterns are a decomposition of the design pattern;
   positioning a scanner at a position;
   performing first exposures with the first and second patterns of the photomask such that a set of first patterns is transferred onto a first row of the wafer and a set of second patterns is transferred onto a second row of the wafer;
   positioning the scanner at the position with an offset less than a scanner field;
   performing second exposures with the first and second patterns of the photomask such that another set of second patterns is transferred onto the first row thereby forming a set of design patterns, and another set of first patterns is transferred onto the second row thereby forming another set of design patterns; and
   performing an etch process on the wafer to form a circuit pattern having a first feature and a second feature different from the first feature, wherein the first feature is transferred from the first pattern on the photomask and the second feature is transferred from the second pattern on the photomask.

10. The method of claim 9, wherein the offset is about half of the scanner field.

11. The method of claim 10, wherein the performing the first exposures and the second exposures each includes moving the scanner by a distance substantially equal to about the scanner field after each exposure of the first and second patterns of the photomask.

12. The method of claim 9, wherein the first pattern includes features that are positioned in a first configuration, and wherein the second pattern includes features that are positioned in a second configuration different from the first configuration.

13. The method of claim 9, wherein the method transfers the sets of design patterns onto the entire wafer without reloading another photomask.

* * * * *